(12) United States Patent
Tsubuku et al.

(10) Patent No.: US 11,594,641 B2
(45) Date of Patent: Feb. 28, 2023

(54) SEMICONDUCTOR DEVICE

(71) Applicant: Japan Display Inc., Tokyo (JP)

(72) Inventors: Masashi Tsubuku, Tokyo (JP); Michiaki Sakamoto, Tokyo (JP); Takashi Okada, Tokyo (JP); Toshiki Kaneko, Tokyo (JP); Tatsuya Toda, Tokyo (JP)

(73) Assignee: Japan Display Inc., Tokyo (JP)

( * ) Notice: Subject to any disclaimer, the term of this patent is extended or adjusted under 35 U.S.C. 154(b) by 68 days.

(21) Appl. No.: 17/111,810

(22) Filed: Dec. 4, 2020

(65) Prior Publication Data

US 2021/0091226 A1    Mar. 25, 2021

Related U.S. Application Data

(63) Continuation of application No. PCT/JP2019/017060, filed on Apr. 22, 2019.

(30) Foreign Application Priority Data

Jun. 6, 2018  (JP) .............................. JP2018-108623

(51) Int. Cl.
 *H01L 29/00* (2006.01)
 *H01L 29/786* (2006.01)
 *H01L 29/417* (2006.01)

(52) U.S. Cl.
 CPC .... *H01L 29/7869* (2013.01); *H01L 29/41733* (2013.01)

(58) Field of Classification Search
 CPC ................. H01L 21/28; H01L 21/0262; H01L 21/02565; H01L 21/02631; H01L 29/7869;
(Continued)

(56) References Cited

U.S. PATENT DOCUMENTS 8,901,562 B2 * 12/2014 Yamada ............ H01L 29/78648
                                                    257/E21.414
9,876,118 B2 *  1/2018 Yamazaki ........... H01L 27/1255
(Continued)

FOREIGN PATENT DOCUMENTS

JP    2014199403 A    10/2014
JP    2016177284 A    10/2016

OTHER PUBLICATIONS

International Search Report dated Jul. 9, 2019 in PCT/JP2019/017060 filed Apr. 22, 2019, citing documents AB-AC therein, 1 pages.
(Continued)

*Primary Examiner* — Nikolay K Yushin
(74) *Attorney, Agent, or Firm* — Maier & Maier, PLLC

(57) ABSTRACT

A semiconductor device includes a gate electrode on a substrate, a gate insulating film on the gate electrode, an oxide semiconductor film via the gate insulating film on the gate electrode, a source electrode and a drain electrode on the oxide semiconductor film, a protective film provided on the source electrode and the drain electrode; and a conductive layer provided on the protective film and overlapped on the oxide semiconductor layer. The protective film includes a first silicon oxide film and a first silicon nitride film. The first oxide film is in contact with the oxide semiconductor layer. The gate insulating film includes a second silicon nitride film and a second silicon oxide film. The second silicon oxide film is in contact with the oxide semiconductor layer. The oxide semiconductor layer has a first region located between the source electrode and the drain electrode in a plan view.

2 Claims, 18 Drawing Sheets

(58) Field of Classification Search
CPC ......... H01L 29/41733; H01L 29/78648; H01L 51/50; H01L 51/5253; H01L 51/5256
See application file for complete search history.

(56) References Cited

U.S. PATENT DOCUMENTS

| | | |
|---|---|---|
| 2012/0175618 A1* | 7/2012 | Yamada ............ H01L 27/14663 257/66 |
| 2014/0061636 A1 | 3/2014 | Miyake et al. |
| 2015/0171115 A1 | 6/2015 | Yamazaki et al. |
| 2016/0274394 A1 | 9/2016 | Yamazaki et al. |
| 2017/0243981 A1* | 8/2017 | Yamazaki ........... H01L 29/7869 |

OTHER PUBLICATIONS

Office Action dated May 10, 2022, in connection with corresponding Japanese Application No. 2018-108623 (6 pp. including machine-generated English translation).

* cited by examiner

SEMICONDUCTOR DEVICE

CROSS REFERENCE TO RELATED APPLICATIONS

This application is based upon and claims the benefit of priority from the prior Japanese Patent Application No. 2018-108623 filed on Jun. 6, 2018, and PCT Application No. PCT/JP2019/017060 filed on Apr. 22, 2019, the entire contents of which are incorporated herein by reference.

FIELD

One embodiment of the present invention relates to a semiconductor device including oxide semiconductor and a method for producing the semiconductor device.

BACKGROUND

Conventionally, a transistor using silicon as a semiconductor layer is used with a display device such as a liquid crystal display device or an organic EL display device. In recent years, there are increasing demands for larger area, higher resolution, and higher frame rate in display devices, and efforts are actively making to meet these demands.

Recently, the development of the transistor using oxide semiconductor instead of silicon has been promoted. The transistor using oxide semiconductor is expected to be able to achieve high mobility (for example, Japanese Laid-Open Patent Publication No. 2016-184764 and Japanese Laid-Open Patent Publication No. 2015-133482). Since the off-leakage current of the transistor using oxide semiconductor is very small, a leakage of electric charge from a holding capacitor is small, a display element can be driven at a low frequency, and a power consumption can be reduced.

SUMMARY

The semiconductor device according to an embodiment of the present invention includes a gate electrode on a substrate, a gate insulating film on the gate electrode, an oxide semiconductor film via the gate insulating film on the gate electrode, a source electrode and a drain electrode on the oxide semiconductor film, a protective film provided on the source electrode and the drain electrode; and a conductive layer provided on the protective film and overlapped on the oxide semiconductor layer. The protective film includes a first silicon oxide film and a first silicon nitride film. The first oxide film is in contact with the oxide semiconductor layer. The gate insulating film includes a second silicon nitride film and a second silicon oxide film. The second silicon oxide film is in contact with the oxide semiconductor layer. The oxide semiconductor layer has a first region located between the source electrode and the drain electrode in a plan view. A part of the first region overlaps the conductive layer.

DESCRIPTION OF EMBODIMENTS

Figure 1A:
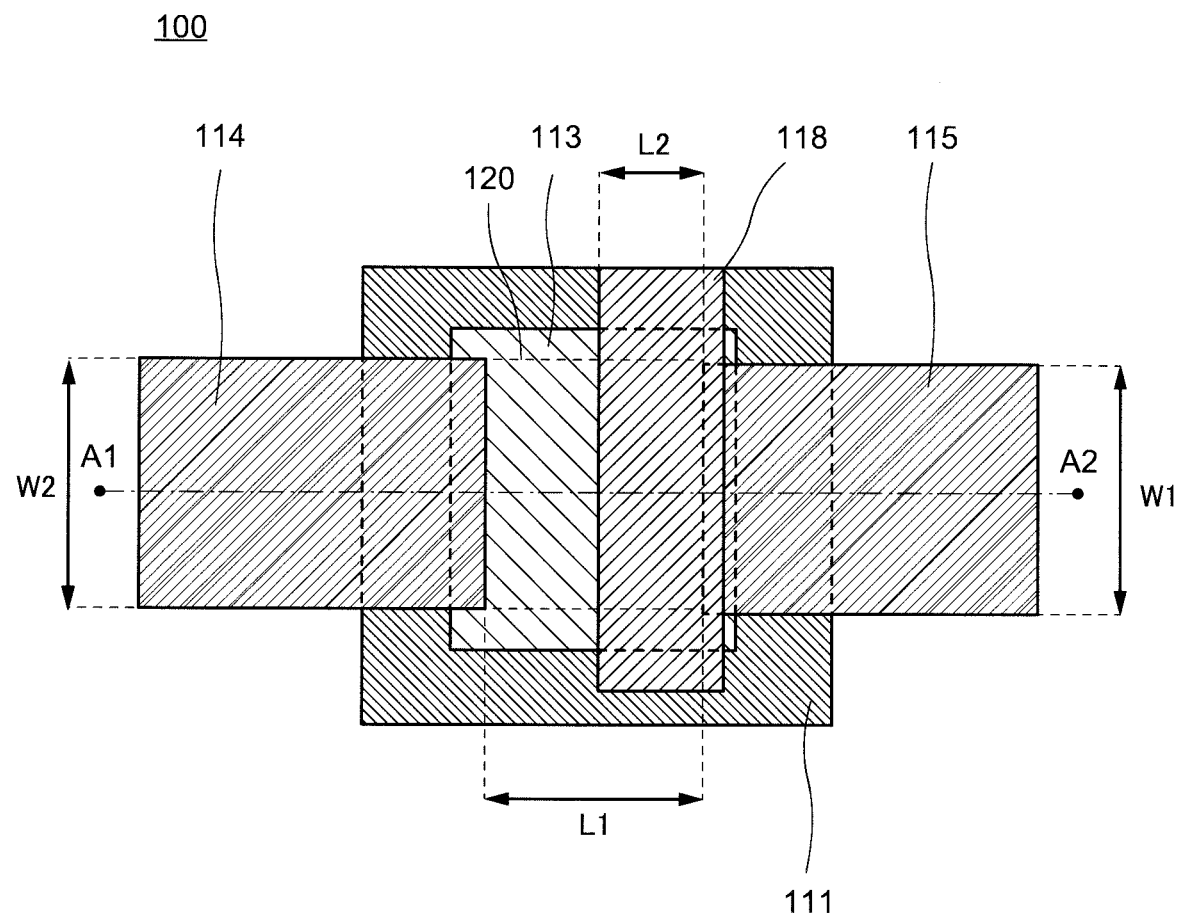
FIG. 1A is a plan view showing a semiconductor device according to an embodiment of the present invention.

Since oxide semiconductor is sensitive to hydrogen and moisture, the characteristics of the transistor using oxide semiconductor may fluctuate after the display device producing process. In particular, the transistor using oxide semiconductor has a problem that the characteristics of the transistor may fluctuate because a large amount of fixed charge is contained in a protective film or a sealing film provided on the oxide semiconductor layer.

In view of the above problems, one of objects of an embodiment of the present invention is to provide a semiconductor device with improved reliability of the transistor.

Hereinafter, embodiments of the present invention will be described with reference to the drawings and the like. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual forms, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and repetitive descriptions thereof may be omitted.

First Embodiment

With reference to FIG. 1A to FIG. 2E, a semiconductor device 100 according to an embodiment of the present invention will be described. In this embodiment, the case where the structure is the bottom-gate transistor will be described.

<Structure of the Semiconductor Device>

Figure 1B:
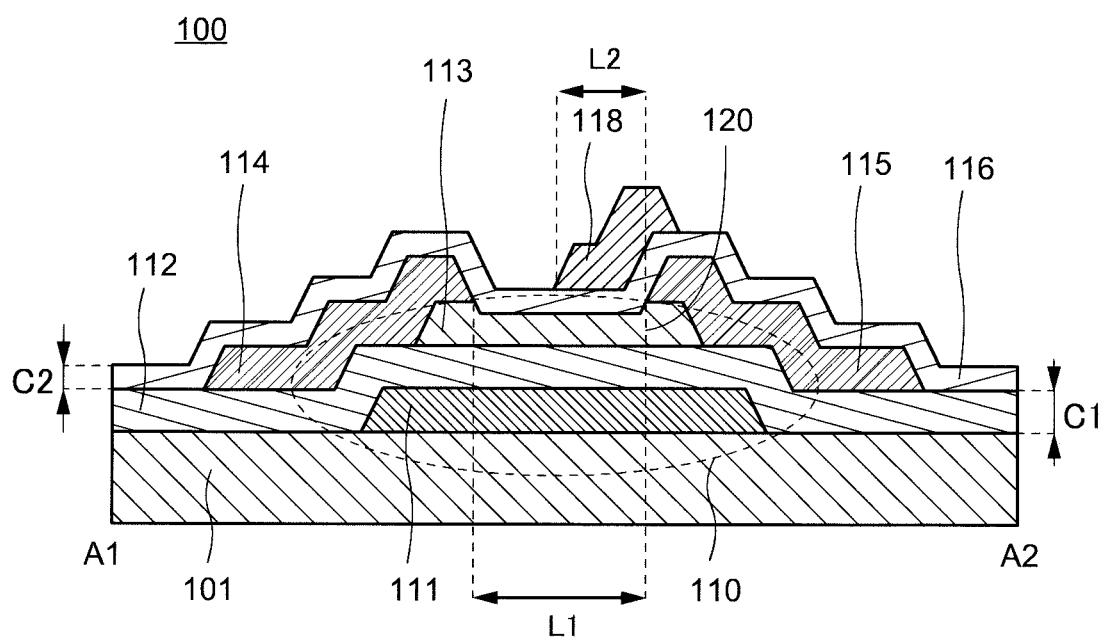
FIG. 1B is a cross-sectional view showing the semiconductor device according to an embodiment of the present invention.

FIG. 1A is a plan view showing the semiconductor device 100 according to this embodiment. FIG. 1B is a cross-sectional view taken along line A1-A2 in FIG. 1A. The semiconductor device 100 includes a substrate 101, a gate electrode 111 on the substrate 101, a gate insulating film 112 on the gate electrode 111, an oxide semiconductor layer 113 overlapping the gate electrode 111 on the gate insulating film 112, a source or drain electrode 114 and a source or drain electrode 115 on the oxide semiconductor layer 113, a protective film 116 on the source or drain electrode 114 and the source or drain electrode 115, and a conductive layer 118. A transistor 110 includes the gate electrode 111, the gate insulating film 112, and the oxide semiconductor layer 113, the source or drain electrode 114, and the source or drain electrode 115.

Usable as the substrate 101 may be a glass substrate, a quartz substrate, a flexible substrate (polyimide, polyethylene terephthalate, polyethylene naphthalate, triacetyl cellulose, a cyclic olefin-copolymer, a cycloolefin polymer, and a resin substrate having a flexibility of another). Use of a flexible resin substrate allows the display device to be bent.

Usable as the gate electrode 111 may be, for example, aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), bismuth (Bi), or the like. Alternatively, an alloy of these metal materials may be used. Still alternatively, a conductive oxide such as ITO (indium tin oxide), IGO (indium gallium oxide), IZO (indium zinc oxide), GZO (zinc oxide containing gallium as a dopant) or the like may be used. The gate electrode 111 may have a single-layer structure or a stack structure.

When a flexible substrate is used as the substrate 101, an undercoat layer (not shown) is preferably provided on the substrate 101. The undercoat layer is a film having a function of preventing hydrogen and moisture contained in the substrate 101 from diffusing into the oxide semiconductor layer 113 or the like. The undercoat layer may be formed of a film of, for example, silicon nitride ($Si_xN_y$), silicon nitride oxide ($SiN_xO_y$, x>y), silicon oxide ($SiO_x$), silicon oxide nitride ($SiO_xN_y$, x>y), aluminum oxide ($Al_xO_y$), aluminum nitride ($Al_xN_y$), aluminum oxide nitride ($Al_xO_yN_z$, y>z), aluminum nitride oxide ($Al_xN_yO_z$, y>z) or the like (x, y and z are arbitrary numerals).

The gate insulating film may be formed of a film of, for example, silicon nitride ($Si_xN_y$), silicon nitride oxide ($SiN_xO_y$, x>y), silicon oxide ($SiO_x$), silicon oxide nitride ($SiO_xN_y$, x>y), aluminum oxide ($Al_xO_y$), aluminum nitride ($Al_xN_y$), aluminum oxide nitride ($Al_xO_yN_z$, y>z), aluminum nitride oxide ($Al_xN_yO_z$, y>z) or the like (x, y and z are arbitrary numerals). The gate insulating film 112 may have a single-layer structure or a stack structure using the materials described above. The insulating film in contact with the oxide semiconductor layer 113 is preferably an oxygen-containing insulating film such as a silicon oxide layer.

The oxide semiconductor layer 113 may contain Group 13 element such as indium and gallium. Usable as the oxide semiconductor layer 113 may be a plurality of different Group 13 elements, and a compound of indium and gallium (IGO). The oxide semiconductor layer 113 may further contain Group 12 element. Usable as the oxide semiconductor layer 113 may be used, for example, IGZO containing indium, gallium, and zinc. The oxide semiconductor layer 113 may contain other elements, and may contain tin as a Group 14 element, titanium as a Group 4 element, zirconium, and the like.

Usable as the oxide semiconductor layer 113 may be materials such as $InO_x$, $ZnO_x$, $SnO_x$, In—Ga—O, In—Zn—O, In—Al—O, In—Sn—O, In—Hf—O, In—Zr—O, In—W—O, In—Y—O, In—Ga—Zn-O, In—Al—Zn—O, In—Sn—Zn—O, In—Hf—Zn—O, In—Ga—Sn—O, In—Al—Sn—O, In—Hf—Sn—O, In—Ga—Al—Zn—O, In—Ga—Hf—Zn—O, In—Sn—Ga—Zn-O. The crystalline of the oxide semiconductor layer 113 is not limited, and the crystalline may be monocrystalline, polycrystalline, microcrystalline, or amorphous. The oxide semiconductor layer 113 preferably have few crystal defects such as oxygen defects. The concentration of hydrogen in the oxide semiconductor layer 113 preferably is low.

Usable as the source or drain electrodes 114, 115 may be materials as with the gate electrode 111, such as aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), bismuth (Bi), or the like. Alternatively, an alloy of these metal materials may be used. Still alternatively, a conductive oxide such as ITO (indium tin oxide), IGO (indium gallium oxide), IZO (indium zinc oxide), GZO (zinc oxide containing gallium as a dopant) or the like may be used. The source or drain electrodes 114, 115 may have a single-layer structure or a stack structure.

The protective film 116 may be formed of a film of, for example, silicon nitride ($Si_xN_y$), silicon nitride oxide ($SiN_xO_y$, x>y), silicon oxide ($SiO_x$), silicon oxide nitride ($SiO_xN_y$, x>y), aluminum oxide ($Al_xO_y$), aluminum nitride ($Al_xN_y$), aluminum oxide nitride ($Al_xO_yN_z$, y>z), aluminum nitride oxide ($Al_xN_yO_z$, y>z) or the like (x, y and z are arbitrary numerals). The protective film 116 may have a single-layer structure or a stack structure. The insulating film in contact with the oxide semiconductor layer 113 is preferably an oxygen-containing insulating film such as a silicon oxide layer.

Usable as the conductive layer 118 may be materials as with the gate electrode 111, such as aluminum (Al), titanium (Ti), chromium (Cr), cobalt (Co), nickel (Ni), zinc (Zn), molybdenum (Mo), copper (Cu), indium (In), tin (Sn), hafnium (Hf), tantalum (Ta), tungsten (W), platinum (Pt), bismuth (Bi), or the like. Alternatively, an alloy of these metal materials may be used. Still alternatively, a conductive oxide such as ITO (indium tin oxide), IGO (indium gallium oxide), IZO (indium zinc oxide), GZO (zinc oxide containing gallium as a dopant) or the like may be used. The source or drain electrodes 114, 115 may have a single-layer structure or a stack structure.

Since oxide semiconductor is sensitive to hydrogen and moisture, the characteristics of the transistor using oxide semiconductor may fluctuate after the display device producing process. In particular, the transistor using oxide semiconductor has a problem that the characteristics of the transistor may fluctuate because a large amount of fixed charge is contained in a protective film or a sealing film provided on the oxide semiconductor layer.

For example, when a transistor using oxide semiconductor is formed, a silicon nitride film is used to prevent moisture from entering the oxide semiconductor layer. As the silicon nitride film provided above the oxide semiconductor layer, it is preferable to use a silicon nitride film having reduced hydrogen. However, the silicon nitride film having reduced hydrogen contains a very large amount of positive fixed charge. A large amount of positive fixed charge is a major factor in the negative shift of the threshold voltage of the transistor. The negative shift of the threshold voltage of the transistor reduces the reliability of the transistor.

Accordingly, one of objects of an embodiment of the present invention is to provide a semiconductor device with improved reliability of the transistor. One of objects of an embodiment of the present invention is to provide a semiconductor device in which the effect of the fixed charge on a protective film side of an oxide semiconductor layer of the transistor is reduced.

Specifically, in order to reduce the effect of the fixed charge on the protective film 116 side of the oxide semiconductor layer 113 of the transistor, the conductive layer 118 is provided above the oxide semiconductor layer 113 via the protective film 116. Providing the conductive layer 118 on the protective film 116 side of the oxide semiconductor layer 113 of the transistor, the effect of a very large amount of positive fixed charge contained in the protective film 116 can be reduced. Thus, fluctuations in the characteristics of the transistor using oxide semiconductor can be suppressed.

As shown in FIG. 1A, in planar view, the oxide semiconductor layer 113 has a region 120 located between the source or drain electrode 114 and the source or drain electrode 115. The region 120 corresponds to a region formed by the length L1 between the source or drain electrode 114 and the source or drain electrode 115, the width W1, W2 of the source or drain electrodes 114, 115. As shown in FIG. 1B, in cross-sectional view, the channel is formed on the gate electrode 111 side of the region 120 in oxide semiconductor layer 113. A part of the region 120 overlaps the conductive layer 118. As shown in FIG. 1A and FIG. 1B, even if there is a region in which the region 120 does not partially overlap the conductive layer 118, the effect of positive fixed charge included in the protective film 116 can reduce.

As described above, as shown in FIG. 1A and FIG. 1B, a part of the region 120 overlaps the conductive layer 118. On the other hand, in an embodiment of the present invention, the conductive layer 118 does not need to be overlapped on all of the region in which the channel is formed, as it is only necessary to reduce the effect of the positive fixed charge contained in the protective film 116.

An area of the conductive layer 118 may overlap an area of the region 120 by more than 0.25, preferably by more than 0.4, more preferably by more than 0.53. As shown in FIG. 1A, the region where the conductive layer 118 and the region 120 overlap is a region formed by the length L2 of the conductive layer and the width W2 of the conductive layer. When the area of the conductive layer 118 is less than 0.4 with respect to the region 120, reducing the effect of the fixed charge contained in the protective film 116 is difficult. The area of the conductive layer 118 may be the same as the area of the region 120.

Therefore, the conductive layer 118 overlaps one of the source or drain electrodes 114, 115, dose not overlap the other of the source or drain electrodes 114, 115.

As shown in FIG. 1B, the ratio (C2/C1) of the capacity C2 of the protective film 116 to the capacity C1 of the gate insulating film 112 is preferably 0.5 or more and 1.5 or less. FIG. 1B shows the semiconductor device in which the film thickness of the gate insulating film 112 is thicker than the film thickness of the protective film 116.

The protective film 116 provided on the oxide semiconductor layer 113 is preferably formed by stacking, for example, a silicon oxide film and a silicon nitride film. Including the silicon nitride film in the protective film 116, the silicon nitride film can prevent impurities from entering the oxide semiconductor layer 113, even if impurities enter from the outside, by the silicon nitride film. On the other hand, when the oxide semiconductor layer 113 is in contact with the silicon nitride film, the oxide semiconductor layer 113 may be susceptible to the fixed charge contained in the silicon nitride film. Therefore, by sandwiching the silicon oxide between the oxide semiconductor layer 113 and the silicon nitride film, the effect of the fixed charge contained in the silicon nitride film can be reduced.

Similarly, the gate insulating film 112 provided under the oxide semiconductor layer 113, for example, a silicon nitride film and a silicon oxide film are preferably stacked. Including the silicon nitride film in the gate insulating film 112, even if impurities enter from the outside, the silicon nitride film from entering the oxide semiconductor layer 113 formed later can prevent. Sandwiching the silicon oxide film between the oxide semiconductor layer 113 and the silicon nitride film, the effect of the fixed charge contained in the silicon nitride film can be reduced.

As described above, in the semiconductor device 100 according to an embodiment of the present application, the effect of the fixed charge contained in the protective film 116 can be reduced by providing the conductive layer 118 so as to overlap a part of the region 120. Thus, the threshold voltage of the transistor 110 will be negative shift can prevent. Since fluctuations in the threshold voltage of the transistor can be suppressed, the reliability of the semiconductor device 100 can be improved.

<Method for Producing the Semiconductor Device>

Next, a method for producing the semiconductor device 100 according to an embodiment of the present invention will be described referring to FIG. 2A to FIG. 2E.

Figure 2A:
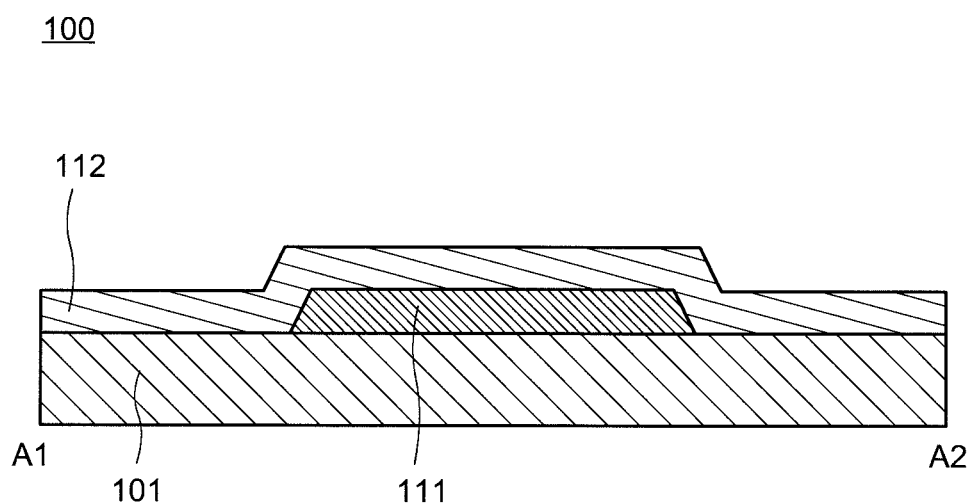
FIG. 2A is a cross-sectional view showing a method for producing the semiconductor device according to an embodiment of the present invention.

FIG. 2A is a diagram showing a process of forming the gate electrode 111 and the gate insulating film 112 on the substrate 101.

The gate electrode 111 is formed by depositing a conductive film on the substrate 101 and then patterning to form the desired shapes. The conductive film is formed in a single-layer structure or a stacked structure using the materials described above by a sputtering method. The film thickness of the gate electrode 111 is preferably 100 nm or more and 500 nm or less.

Next, the gate insulating film 112 is formed on the gate electrode 111. The gate insulating film 112 is formed in a single-layer structure or a stacked structure using the materials described above by a sputtering method or a plasma-enhanced CVD method. The film thickness of the gate insulating film 112 is preferably 100 nm or more and 600 nm or less. When the film thickness of the gate insulating film 112 is less than 100 nm, it is difficult to suppress hydrogen and moisture diffusing into the oxide semiconductor layer 113. As the gate insulating film 112, for example, it is preferred that a silicon nitride film and a silicon oxide film are stacked. By including the silicon nitride film in the gate insulating film 112, even if impurities enter from the outside, it is possible to prevent the silicon nitride film from entering the oxide semiconductor layer 113 formed later. As the gate insulating film 112, it is preferable to use a material capable of releasing oxygen by heat treatment. As materials capable of releasing oxygen by heat treatment, it is preferable to use a silicon oxide film. Oxygen is released from the gate insulating film 112 by heat treatment after providing the oxide semiconductor layer 113 in contact with the gate insulating film 112.

Figure 2B:
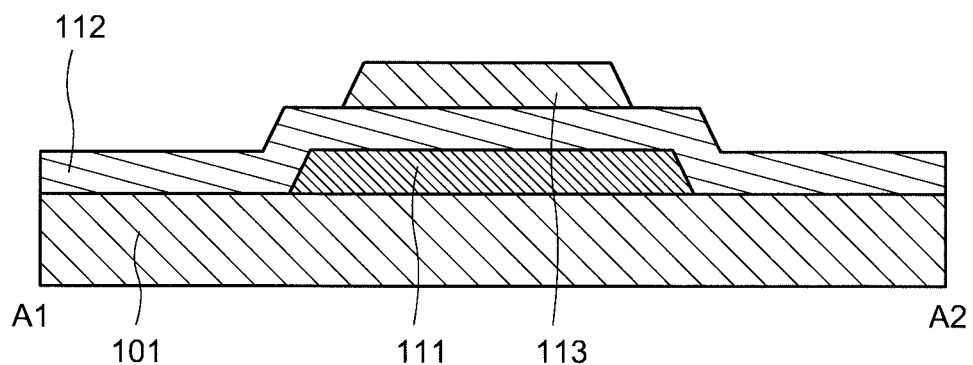
FIG. 2B is a cross-sectional view showing a method for producing the semiconductor device according to an embodiment of the present invention.

FIG. 2B is a diagram showing a process of forming the oxide semiconductor layers 113. The oxide semiconductor layer 113 is formed by forming an oxide semiconductor film on the gate insulating film 112 and then patterning the oxide semiconductor layer 113 to form a desired shape. The oxide semiconductor film is preferably formed at 30 nm or more and 100 nm or less by a sputtering method.

The power source applied to the oxide semiconductor target may be a direct current (DC) or an alternating current power source (AC), and can be determined by the shape and composition of the oxide semiconductor target. As the oxide semiconductor target, for example, when InGaZnO is used, In:Ga:Zn:O=1:1:1:4 ($In_2O_3$:$Ga_2O_3$:ZnO=1:1:2) can be used. The composition ratio may be determined in accordance with the purpose such as the characteristics of the transistor.

As the sputtering gas for forming the oxide semiconductor film, oxygen gas, mixed gas of oxygen and rare gas, or rare gas can be used. As the sputtering gas for forming the oxide semiconductor film, mixed gas of oxygen and rare gas is preferably used, and the flow rate ratio of the oxygen gas to the rare gas is more preferably 5% or more.

The oxide semiconductor layer 113 may be heat-treated. The heat treatment may be performed before patterning the oxide semiconductor film or after patterning. Since the volume of the oxide semiconductor layer 113 may be shrunk by heat treatment, the heat treatment preferably performs before patterning. By heat-treating the oxide semiconductor layer 113, it is possible to improve the film quality such as reducing the hydrogen concentration and improving the density of the oxide semiconductor layer 113.

The heat treatment performed on the oxide semiconductor layers 113 can be performed at atmospheric pressure or low pressure (vacuum) in the presence of nitrogen, dry air, or atmosphere. The heating temperature is 250° C. to 500° C., preferably 350° C. to 450° C. The heating time is, for example, 15 minutes or more and 1 hour or less. Oxygen is introduced into or moved to an oxygen vacancy in the oxide semiconductor layer 113 by heat treatment, whereby the oxide semiconductor layer 113 having few crystal defects and high crystallinity can be obtained. By the heat treatment, the hydrogen concentration contained in the oxide semiconductor layer 113 can be reduced.

Figure 2C:
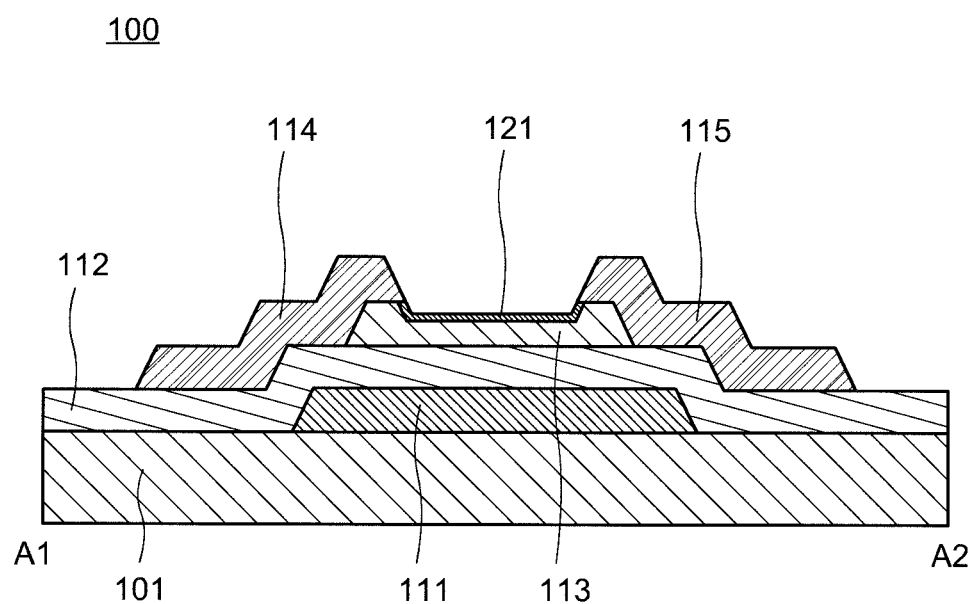
FIG. 2C is a cross-sectional view showing a method for producing the semiconductor device according to an embodiment of the present invention.

FIG. 2C is a diagram showing a process of forming the source or drain electrodes 114, 115 on the oxide semiconductor layer 113. The source or drain electrodes 114 and 115 are formed by depositing a conductive film on the oxide semiconductor layer 113 and then patterning to form a desired shape. The conductive film is formed in a single-layer structure or a stacked structure by using materials described above by a sputtering method. The film thickness of the source or drain electrodes 114, 115 is preferably 100 nm or more and 800 nm or less.

When the conductive film on the oxide semiconductor layer 113 is processed into a desired shape, the surface of the oxide semiconductor layer 113 may be damaged. A damaged region 121 contains a large amount of oxygen deficiency. As shown in FIG. 1A, the oxide semiconductor layer 113 is the region exposed from the source or drain electrodes 114, 115. When the region 121 contains a large amount of oxygen deficiency, the characteristic of the transistor may be deteriorated.

Therefore, oxygen is preferably supplied to the region 121 in which the oxide semiconductor layer 113 is damaged to supply for oxygen deficiency. As a result, the oxygen deficiency contained in the oxide semiconductor layer 113 can be reduced.

Figure 2D:
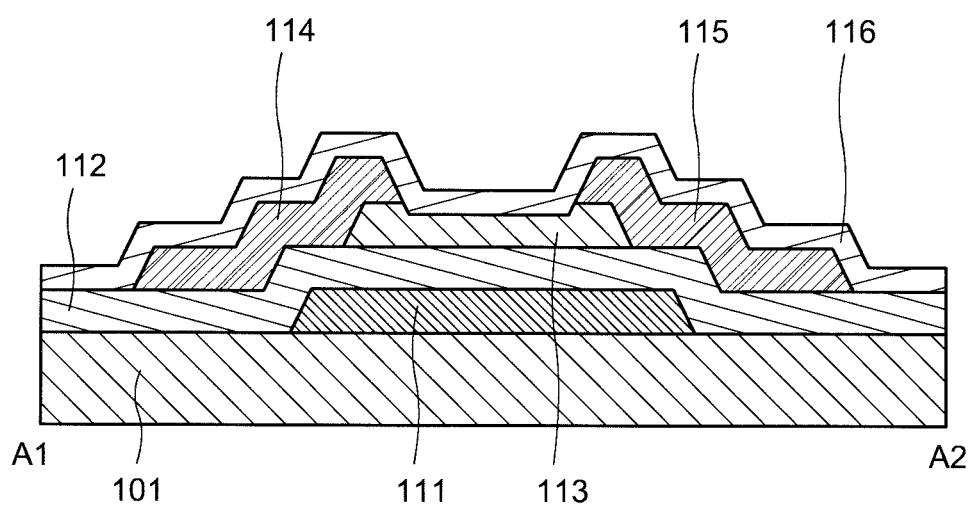
FIG. 2D is a cross-sectional view showing a method for producing the semiconductor device according to an embodiment of the present invention.

In this embodiment, the protective film 116 is formed on the oxide semiconductor layer 113. FIG. 2D is a diagram showing a process of forming the protective film 116 on the oxide semiconductor layer 113. The protective film 116 is formed in a single layer structure or a stacked structure using the materials described above by a plasma-CVD method. The film thickness of the protective film 116 is preferably 100 nm or more and 600 nm or less. When the film thickness of the protective film 116 is less than 100 nm, it is difficult to suppress hydrogen and moisture diffusing into the oxide semiconductor layer 113. The protective film 116 is preferably formed by stacking, for example, a silicon oxide film and a silicon nitride film. As the protective film 116, material capable of releasing oxygen by heat treatment is preferably used. As the protective film 116, for example, a silicon oxide film is preferably used. After the protective film 116 is provided in contact with the oxide semiconductor layer 113, oxygen is released from the protective film 116 by heat treatment. Oxygen can be supplied to the damaged region 121 of the oxide semiconductor layer 113 by the released oxygen. As a result, oxygen deficiency contained in the oxide semiconductor layer 113 can be reduced. By including the silicon nitride film in the protective film 116, it is possible to prevent the silicon nitride film from entering the oxide semiconductor layer 113, even if impurities enter from the outside.

Next, heat treatment is performed on the protective film 116. The heat treatment may be performed at atmospheric or low pressure (vacuum) in the presence of nitrogen, dry air, or air. The heating temperature is 300° C. to 400° C. The heating time is, for example, 15 minutes or more and 1 hour or less.

By the heat treatment, oxygen is released from the protective film 116. As a result, oxygen is supplied to the region 121 in which the oxide semiconductor layer 113 is damaged. Since oxygen is filled in the oxygen deficiency contained in the region 121, oxygen deficiency can be reduced.

As the silicon nitride film contained in the protective film 116, it is preferable to use a silicon nitride film having reduced hydrogen. However, the silicon nitride film having reduced hydrogen contains a very large amount of positive fixed charge. A large amount of positive fixed charge is a major factor in negative shift of the threshold voltage of the transistor.

Figure 2E:
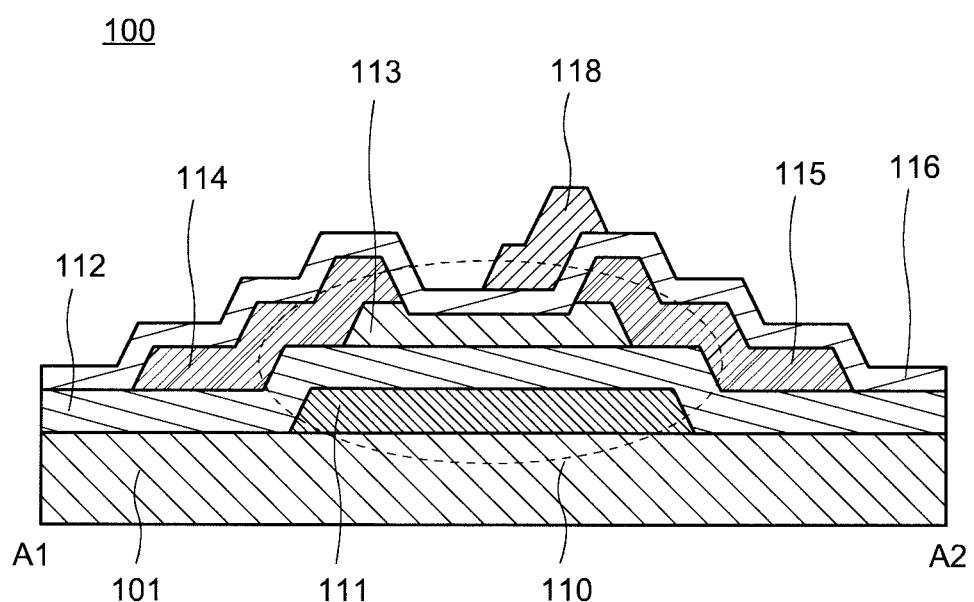
FIG. 2E is a cross-sectional view showing a method for producing the semiconductor device according to an embodiment of the present invention.

Next, in the transistor 110, in order to reduce the effect of the fixed charge near the interface of the oxide semiconductor layer 113 with the protective film 116, the conductive layer 118 is formed above the oxide semiconductor layer via the protective film 116. FIG. 2E is a diagram showing a process of forming the conductive layer 118 above the oxide semiconductor layer 113 with the protective film 116 interposed therebetween. The conductive layer 118 is formed by forming a conductive film on the protective film 116 and then patterning the conductive film to form a desired shape. The conductive film is formed in a single-layer structure or a stacked structure by using materials described above by a sputtering method. The film thickness of the conductive layer 118 is preferably 100 nm or more and 800 nm or less.

By the above process, the semiconductor device shown in FIG. 1A and FIG. 1B can be produced. By providing the conductive layer 118 on the protective film 116 so that it is overlapped with the portion of the region 120, the effect of the very large amount of positive fixed charge in the protective film 116 can be reduced. As a result, fluctuation in the characteristic of the transistor using the oxide semiconductor can be suppressed, so that the reliability of the semiconductor device can be improved.

Second Embodiment

In this embodiment, a semiconductor device 100A according to an embodiment of the present invention will be described by referring to FIG. 3A and FIG. 3B. The same structure and process as the semiconductor device of the first embodiment will be omitted.

Figure 3A:
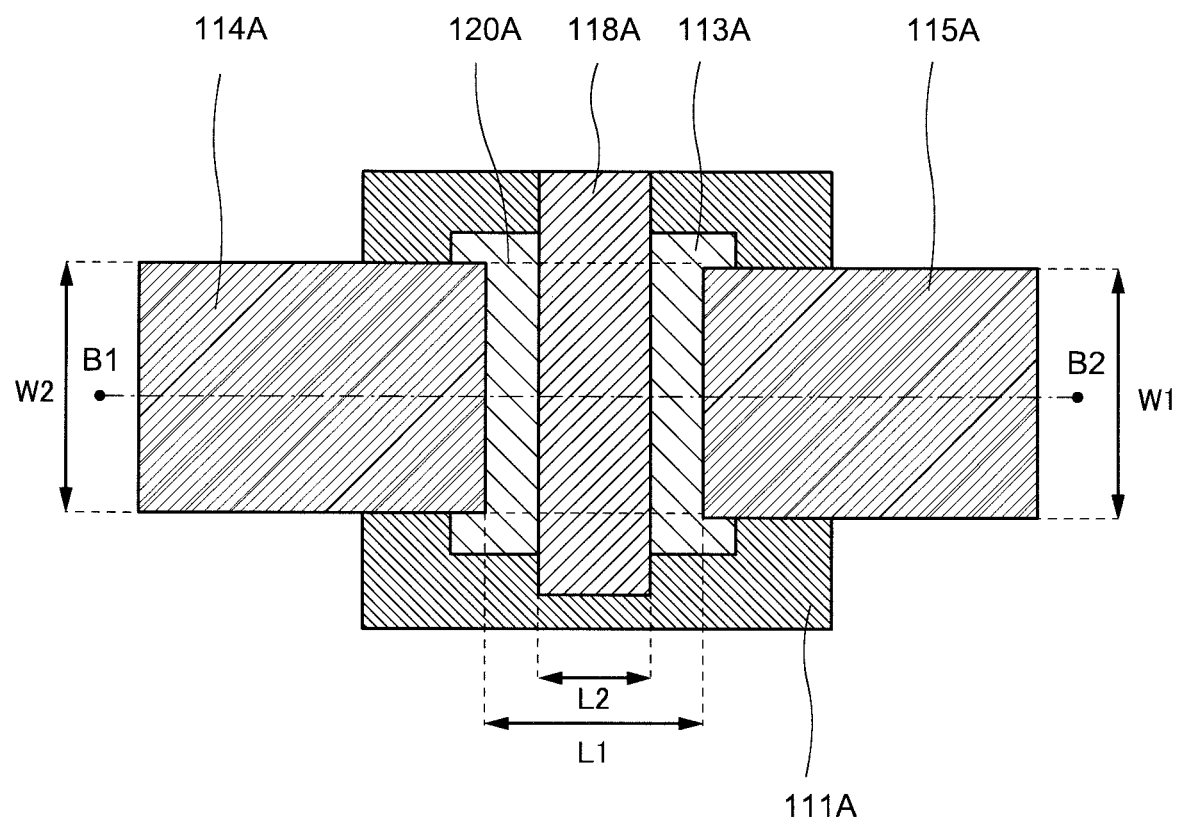
FIG. 3A is a plan view showing a semiconductor device according to an embodiment of the present invention.
Figure 3B:
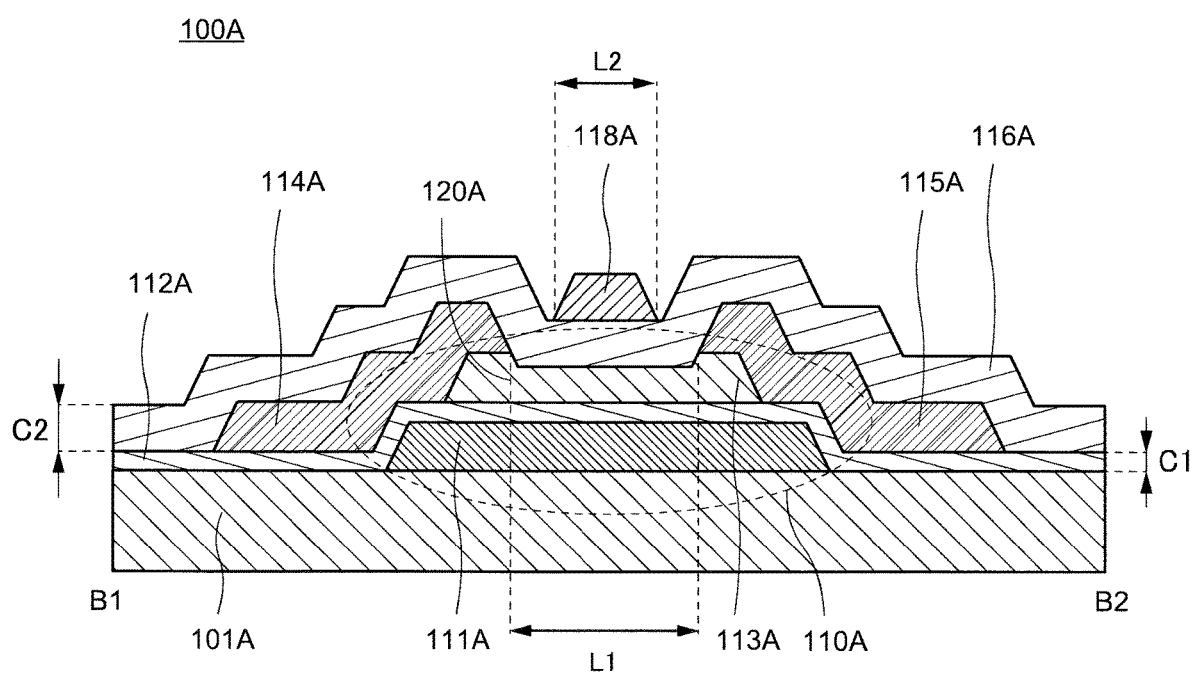
FIG. 3B is a cross-sectional view showing the semiconductor device according to an embodiment of the present invention.

FIG. 3A is a plan view showing the semiconductor device 100A according to an embodiment, and FIG. 3B is a cross-sectional view taken along B1-B2 line in FIG. 3A. The semiconductor device 100A includes a substrate 101A, a gate electrode 111A on the substrate 101A, a gate insulating film 112A on the gate electrode 111A, an oxide semiconductor layer 113A overlapping the gate electrode 111A on the gate insulating film 112A, source or drain electrodes 114A, 115A on the oxide semiconductor layer 113A, a protective film 116A on the source or drain electrodes 114A, 115A, and a conductive layer 118A. A transistor 110A includes the gate electrode 111A, the gate insulating film 112A, the oxide semiconductor 113A, and the source or drain electrode 114A, 115A. In the semiconductor device 100A according to this embodiment, similarly to the first embodiment, in planar view, the oxide semiconductor layer 113A has the region layer 120A located between the source or drain electrode layer 114A and the source or drain electrode layer 115 A. The part of region 120A overlaps the conductive layer 118A.

As shown in FIG. 3A and FIG. 3B, the conductive layer 118A preferably overlaps the region 120A by ¼ or more. As shown in FIG. 3A, the region where the conductive layer 118A and the Region 120A overlap is a region formed by the length L2 and the width W2 of the conductive layer. When the area of the conductive layer 118A is less than ¼ of the area 120A, reducing the effect of the fixed charge contained in the protective film 116A is difficult.

Therefore, as shown in FIG. 3A, the conductive layer 118A may not overlap both the source electrode and drain electrode.

As shown in FIG. 3B, the ratio (C2/C1) of the capacity C2 of the protective film 116A to the capacity C1 of the gate insulating film 112A is preferably 0.5 or more and 1.5 or less. FIG. 3B shows the semiconductor device in which the film thickness of the gate insulating film 112A is thicker than the film thickness of the protective film 116A.

The protective film 116A provided on oxide the semiconductor layer 113A, for example, it is preferred that a silicon oxide film and a silicon nitride film are stacked. Since the protective film 116A contains the silicon nitride film, it is possible to prevent the silicon nitride film from entering the oxide semiconductor layer 113A even if impurities are mixed in from the outside. On the other hand, when the oxide semiconductor layer 113A is in contact with the silicon nitride layer, it may be easily affected by the fixed charge contained in the silicon nitride film. Therefore, by interposing a silicon oxide film between the oxide semiconductor layer 113A and the silicon nitride film, the effect of fixed charge contained in the silicon nitride layer can be reduced.

Similarly, in the gate insulating film 112A provided under the oxide semiconductor layer 113A, for example, it is preferable that a silicon nitride film and a silicon oxide film are stacked. Since the gate insulating film contains the silicon nitride film, even if impurities enter from the outside, it is possible to prevent the silicon nitride film from entering the oxide semiconductor layer 113A formed later. By sandwiching the silicon oxide film between the oxide semiconductor layer 113A and the silicon nitride film, the effect of fixed charge contained in the silicon nitride film can be reduced.

As described in this embodiment, even when the conductive layer 118A does not overlap with both the source electrodes or drain electrodes 114A and 115A, the effect of the fixed charge included in the protective film 116A can be reduced. Therefore, since fluctuations in the characteristics of the transistor using the oxide semiconductor can be suppressed, the reliability of the semiconductor device 100A can be improved.

Third Embodiment

In this embodiment, a semiconductor device 100B according to an embodiment of the invention will be described with reference to FIG. 4A and FIG. 4B. The same structure and process as the semiconductor device of the first embodiment will be omitted.

<Structure of the Semiconductor Device>

Figure 4A:
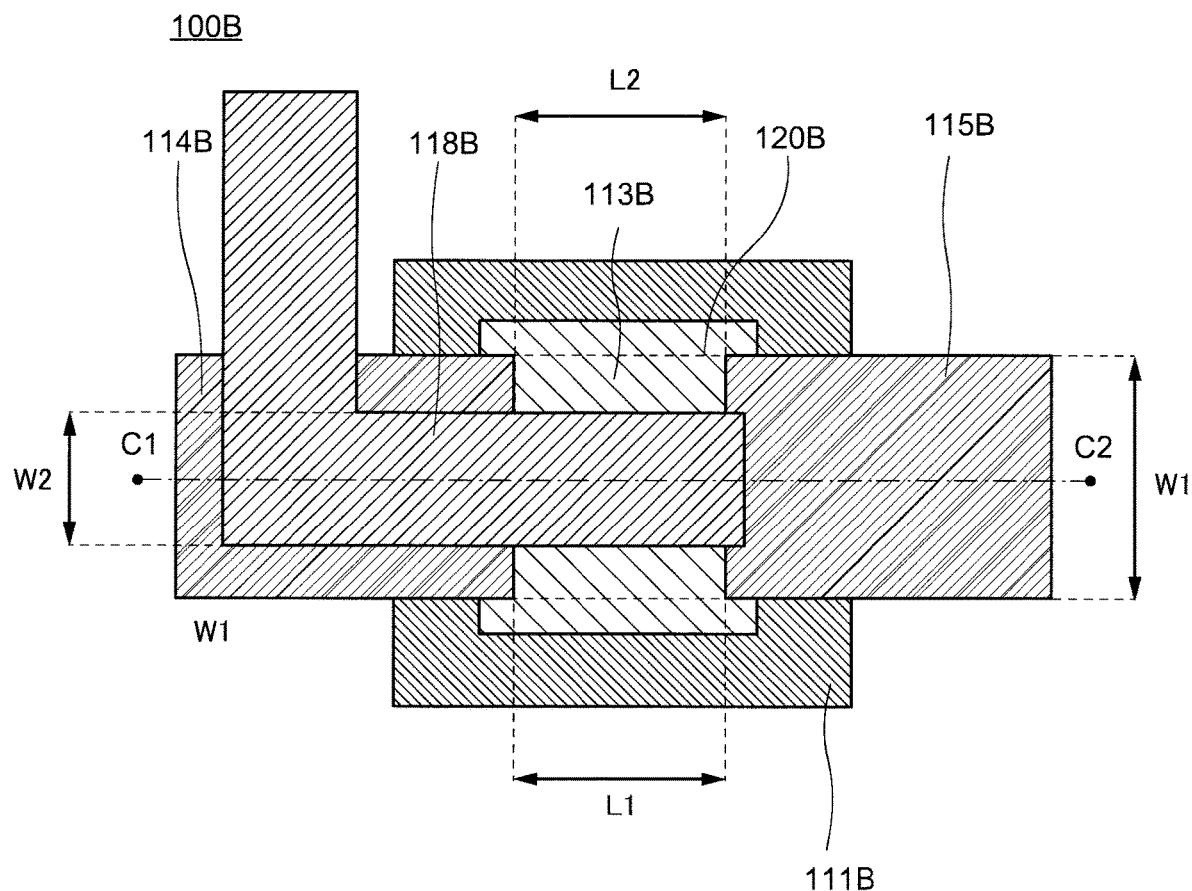
FIG. 4A is a plan view showing a semiconductor device according to an embodiment of the present invention.
Figure 4B:
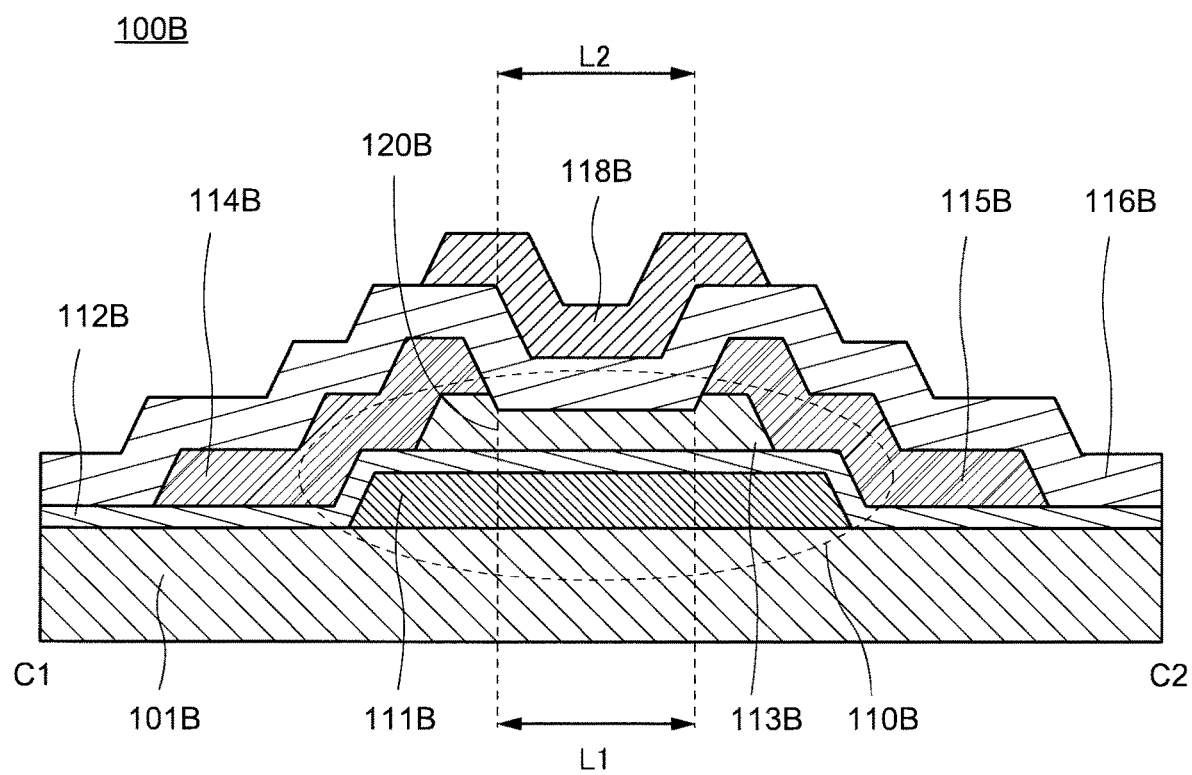
FIG. 4B is a cross-sectional view showing the semiconductor device according to an embodiment of the present invention.

FIG. 4A is a plan view of the semiconductor device 100B according to this embodiment, FIG. 4B is a cross-sectional view taken along the line C1-C2 in FIG. . . . 4A. The semiconductor device 100B includes a substrate 101B, a gate electrode 111B on the substrate 101B, a gate insulating film 112B on the gate electrode 111B, an oxide semiconductor layer 113B overlapped with the gate electrode 111B on the gate insulating film 112B, source or drain electrodes 114B, 115B on the oxide semiconductor layer 113B, a protective film 116B on the source or drain electrodes 114B, 115B, and a conductive layer 118B. A transistor 110B is composed of the gate electrode 111B, the gate insulating film 112B, the oxide semiconductor layer 113B, the source or drain electrodes 114B, 115B. In the semiconductor device 100B according to this embodiment, similarly to the first embodiment, in planar view, the oxide semiconductor layer 113B has a region 120B located between the source or drain electrode 114B and the source electrode or the drain electrode 115B. A part of the region 120B is overlapped with the conductive layer 118B.

As shown in FIG. 4A and FIG. 4B, the area of the conductive layer 118B is larger than 0.25, preferably 0.4 or more, and more preferably 0.53 or more, with respect to the area of the region 120B. As shown in FIG. 4A, the region where the conductive layer 118B and the region 120B overlap is a region formed by the length L2 and the width W2 of the conductive layer. When the area of the conductive layer 118B is less than 0.4 with respect to the region 120B, it becomes difficult to reduce the effect of the fixed charge contained in the protective film 116B.

Therefore, as shown in FIG. 4A, when the region 120B is exposed from the conductive layer 118B, the conductive layer 118B may be overlapped on both the source electrode and drain electrode.

As shown in FIG. 4B, the ratio (C2/C1) of the capacitance C2 of the protective film 116B to the capacitance C1 of the gate insulating film 112B is preferably 0.5 or more and 1.5 or less. In FIG. 4B, the film thickness of the gate insulating film 112B shows a semiconductor device thinner than the film thickness of the protective film 116B.

As the protective film 116B provided on the oxide semiconductor layer 113B, for example, it is preferable that a silicon oxide film and a silicon nitride film are stacked. Since the protective film 116B contains the silicon nitride film, it is possible to prevent the silicon nitride film from entering the oxide semiconductor layer 113B even if impurities are entered in from the outside. On the other hand, when the oxide semiconductor layer 113B is in contact with the silicon nitride film, the oxide semiconductor film 113B may be easily affected by the fixed charge contained in the silicon nitride film. Therefore, by sandwiching the silicon oxide film between the oxide semiconductor layer 113B and the silicon nitride film, the effect of the fixed charge contained in the silicon nitride film can be reduced.

Similarly, in the gate insulating film 112B provided under the oxide semiconductor layer 113B, for example, it is preferable that a silicon nitride film and a silicon oxide film are stacked. Since the gate insulating film 112B contains the silicon nitride film, even if impurities enter from the outside, it is possible to prevent the silicon nitride film from entering the oxide semiconductor layer 113B later formed. By sandwiching the silicon oxide film between the oxide semiconductor layer 113B and the silicon nitride film, the effect of the fixed charge contained in the silicon nitride film can be reduced.

As described in this embodiment, even when the conductive layer 118B is overlapped on both the source or drain electrodes 114, 115, the effect of the fixed charge contained in the protective film 116A can be reduced. Therefore, fluctuations in the characteristics of transistor using oxide semiconductor can be suppressed, and the reliability of the semiconductor devices can be improved.

Fourth Embodiment

In this embodiment, a display device 200 according to an embodiment of the present invention will be described with reference to FIG. 5 and FIG. 6. The display device 200 is an example of a display device using the semiconductor device 100 according to the first embodiment. However, the transistors used in the display device 200 may be the semiconductor device 100A according to the second embodiment and the semiconductor device 100B according to the third embodiment.

<Outline of the Display Device 200>

Figure 5:
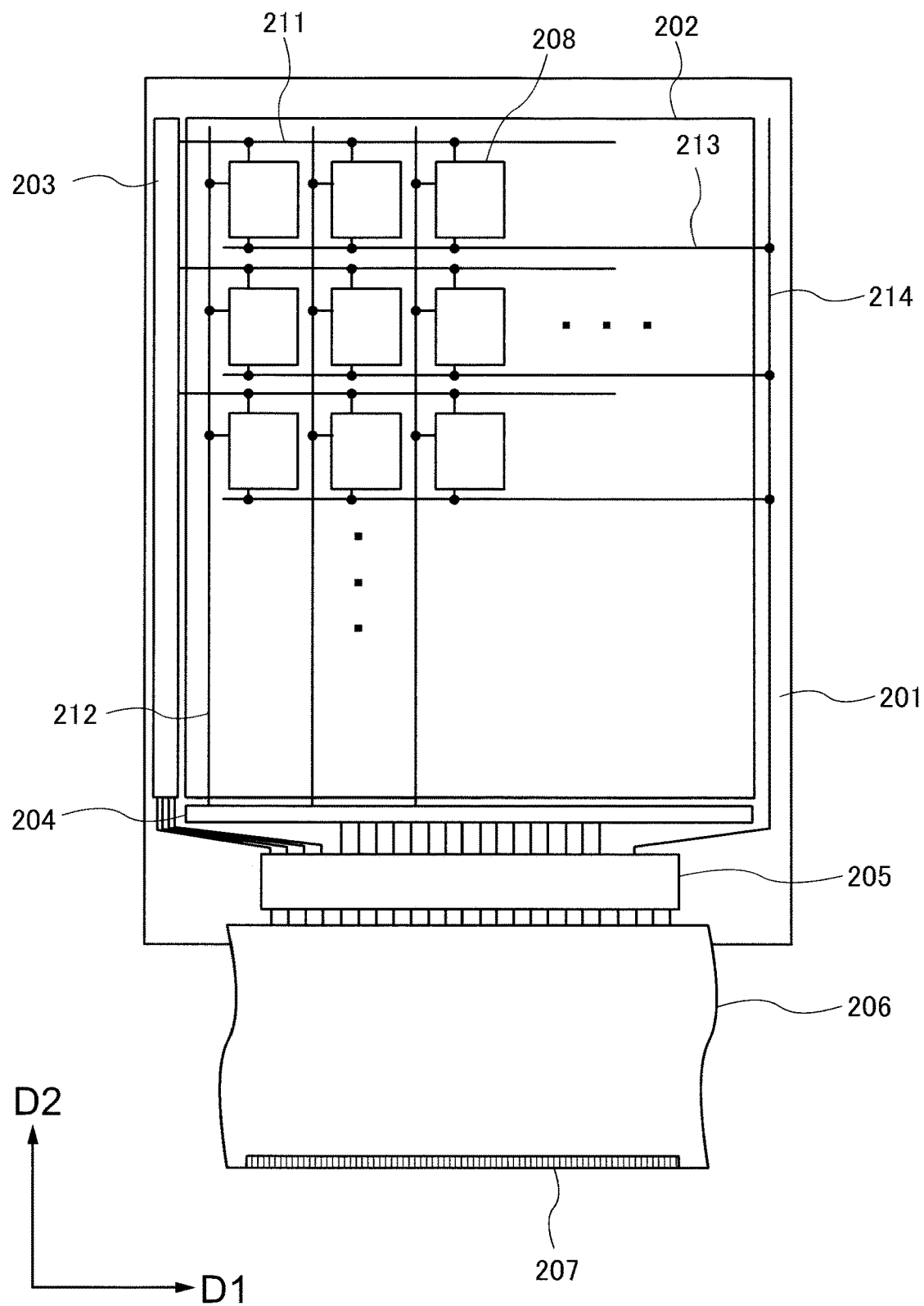
FIG. 5 is a plan view showing a display device according to an embodiment of the present invention.

FIG. 5 is a plan view showing an overview of the display device 200 according to an embodiment of the present invention. FIG. 5 shows a simple circuit diagram of a transistor array substrate with transistors and wirings arranged. The transistor array substrate has a plurality of pixels 208 arranged in a matrix of M rows and N columns (M and N are natural numbers). Each pixel 208 is connected to a common wiring 214. A region provided with the plurality of pixels 208 is referred to as a display region 202.

A gate driver circuit 203 is a driver circuit that selects a wiring for supplying a data signal corresponding to the gradation of each pixel 208. A gate wiring 211 extending in the first direction D1 is connected to the gate driver circuit 203. The gate wiring 211 is a driver circuit that provides a scan signal to each pixel 208. A data wiring 212 extending in the second direction D2 is connected to a data driver circuit 204. The data wirings 212 are provided corresponding to each pixel 208. The common wiring 214 is a wiring to which a voltage common to each pixel 208 is supplied. The common wiring 214 is commonly connected to the pixels 208 via a common wiring 213 extending in the first direction D1. The data driver circuit 204 provides sequential scanning signals to the pixels of the row selected by the gate driver circuit 203.

The gate driver circuit 203 and the data driver circuit 204 are connected to the driver IC 205 via wiring. The data driver circuit 204 may be provided inside the driver IC 205. The common wiring 214 is also connected to the driver IC 205. The driver IC 205 is connected to the FPC 206 via terminals. FPC 206 is provided with an external terminal 207 for connecting to an external device.

<Structure 1 of the Pixel 208>

In this embodiment, as a display device, a case where the organic EL display device of the top emission type. FIG. 6 is cross-sectional view of the pixel 208. The pixel 208 has, on the substrate 101, at least a light emitting element 330 and the transistor 110 according to the first embodiment.

Figure 6:
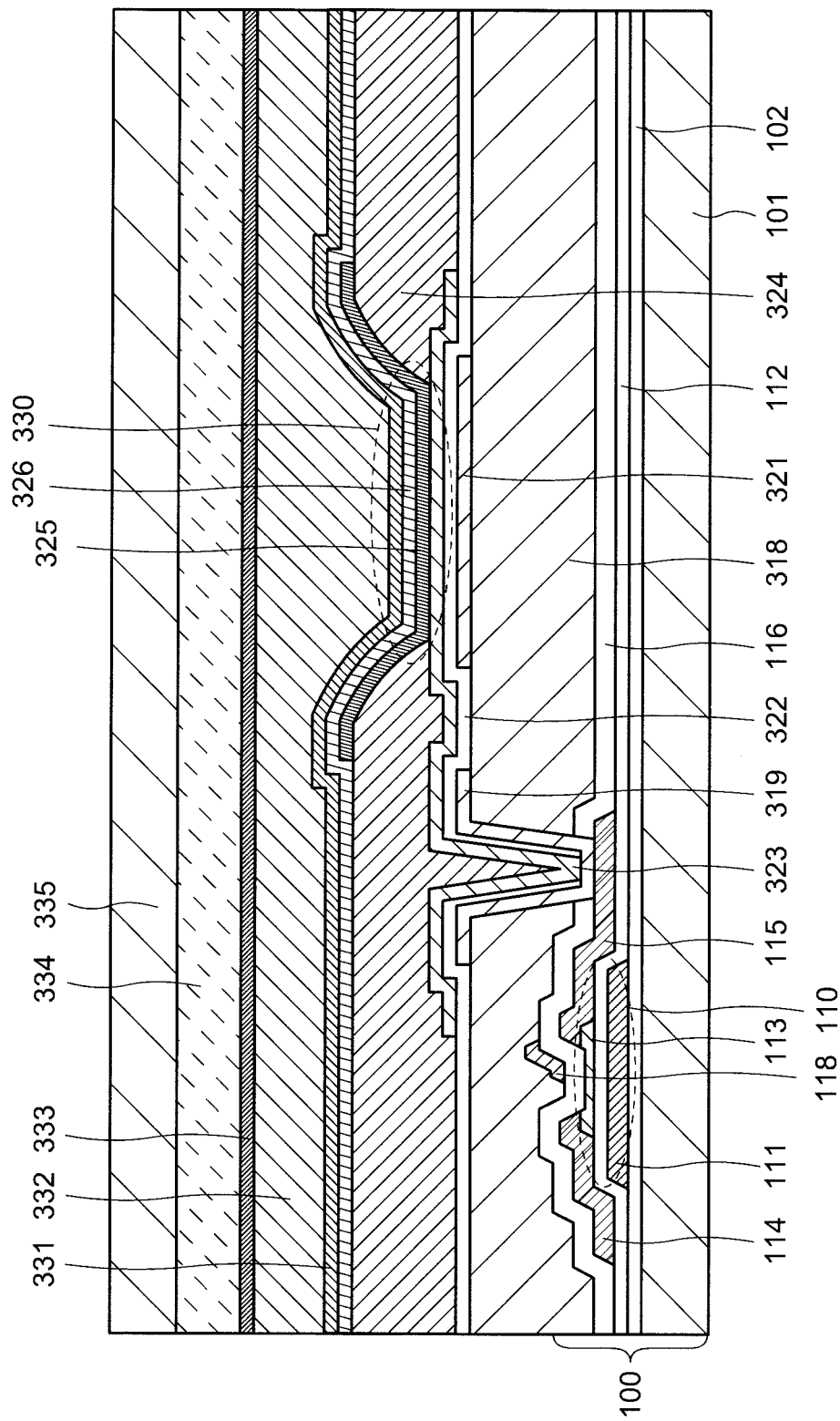
FIG. 6 is a cross-sectional view showing a pixel of a display device according to an embodiment of the present invention.

In FIG. 6, an undercoat layer 102 is provided between the substrate 101 and the gate electrode 111. By providing the undercoat layer 102, hydrogen and moisture from the substrate 101 can be suppressed from diffusing into such the oxide semiconductor layer 113.

The protective film 116 is provided over the transistor 110. The conductive layer 118 is provided on the protective film 116. As described in FIG. 1A and FIG. 1B, a portion of the region 120 of the transistor 110 is overlapped with the conductive layer 118. In FIG. 6, region 120 in the transistor 110 is not shown. Regarding the detailed description of the region 120 of the transistor 110, the description regarding FIG. 1A may be referred to.

A planarization film 318 is provided on the protective film 116 and the conductive layer 118. Usable as the planarization film 318 may be polyimide, polyamide, acrylic, epoxy, or the like. The planarization film 318 of such a material may be formed by a solution application method, and have a high effect of flattening. The protective film 116 and the planarization film 318 are provided with an opening.

Transparent conductive layers 319 and 321 are provided on the planarization film 318. The transparent conductive layer 319 is connected to the source or drain electrode 115 via an opening. The transparent conductive layers 319, 321 are formed of an indium oxide-based transparent conductive layer (i.e., ITO), a zinc oxide-based transparent conductive layer (i.e., IZO, ZnO) or the like. An insulating film 322 is provided on the transparent conductive layers 319, 321. Usable as the insulating film 322 may be a silicon oxide film or a silicon nitride film.

On the insulating film 322, a pixel electrode 323 is provided. In this embodiment, the pixel electrode 323 functions as an anode. For example, in the case of the top emission type, a metallic film with high reflectivity is used as the pixel electrode 323. Alternatively, the pixel electrode 323 is formed of a metal material having a high reflectance or formed to have a stack structure of a transparent conductive layer having a high work function such as an indium oxide-based transparent conductive layer (i.e., ITO), a zinc oxide-based transparent conductive layer (i.e., IZO, ZnO) or the like and a metal film. In the case of the bottom emission type, the transparent conductive layer described above is used as the pixel electrode 323.

An insulating film 324 is provided on the pixel electrode 323. An organic resin such as a polyimide, polyamide, acrylic, epoxy, or siloxane-based resin is used as the insulating film 324. The insulating film 324 has an opening in a portion of the pixel electrode 323. The insulating film 324 is provided to cover the edge of the pixel electrode 323 and function as a member to isolate the adjacent pixel electrode 323. Therefore, the insulating film 324 is generally referred to also as a "partition" or a "bank". A portion of the pixel electrode 323 exposed from the insulating film 324 is a light emitting region of the light emitting element 330. It is preferred that the opening of the insulating film 324 has a tapering inner wall. This may decrease a coverage fault at the time of formation of an organic layer described below. The insulating film 324 may not only cover the edges of the pixel electrode 323, but may also function as a filler to fill the recesses caused by the openings in the planarization film 318 and the insulating film 322.

An organic layer 325 is provided on the pixel electrode 323. The organic layer 325 has a light emitting layer composing at least an organic material and functions as a light-emitting part of the light emitting element 330. The organic layer 325 includes at least one of an electron injection layer, an electron transport layer, a hole injection layer, and a hole transport layer, in addition to the light-emitting layer. The organic layer 325 is provided to cover the light emitting region, i.e., to cover opening of the insulating film 324 in the light emitting region.

In this embodiment, the organic layer 325 includes a light emitting layer that emits light of a desired color. The organic layer 325 having a different light emitting layer is provided on each pixel electrode. Thus, the display device 200 can display R, G, and B colors. That is, in this embodiment, the light emitting layer included in the organic layer 325 is discontinuous between the adjacent pixel electrodes 323. Although not shown, the various charge-transporting layers included in the organic layer 325 may be contiguous between the adjacent pixel electrodes 323. It is possible to use known structures and known materials in the organic layer 325, and is not limited to the organic layer 325. The organic layer 325 has a light-emitting layer that emits white light, and the display device may display each color of RGB through a color filter. The organic layer 325 may also be provided on the insulating film 324.

A counter electrode 326 is provided on the insulating film 324 and the organic layer 325. In this embodiment, the counter electrode 326 functions as a cathode. Since the display device 200 according to this embodiment is a top-emission type, a transparent electrode is used as the counter electrode 326. As thin film constituting the transparent electrode, an MgAg thin film or the transparent conductive layer (ITO or IZO) is used. The counter electrode 326 is provided on the insulating film 324 across the each pixel. The counter electrode 326 is electrically connected to the external terminal via a lower conductive layer at a peripheral region near the end portion of display region.

In this embodiment, the light emitting element 330 includes the pixel electrode 323 (anode), the organic layer 325, and the counter electrode 326 (cathode).

An inorganic insulating film 331, an organic insulating film 332, and an inorganic insulating film 333 are provided on the counter electrode 326. The inorganic insulating film 331, the organic insulating film 332, and the inorganic insulating film 333 function as a sealing film for preventing moisture or oxygen from entering the light emitting element 330. By providing a sealing film over the light emitting element 330, entry of moisture or oxygen into the light emitting element 330 can be prevented. Thus, the reliability of the display device 200 can be improved.

The inorganic insulating film 331 and the inorganic insulating film 333 may each be formed of a film of, for example, silicon nitride ($Si_xN_y$), silicon oxide nitride ($SiO_xN_y$, x>y), silicon nitride oxide ($SiN_xO_y$, x>y), aluminum oxide ($Al_xO_y$), aluminum nitride ($Al_xN_y$), aluminum oxide nitride ($Al_xO_yN_z$, y>z), aluminum nitride oxide ($Al_xN_yO_z$, y>z) or the like (x, y and z are arbitrary numerals). The organic insulating film 332 may be formed of polyimide resin, acrylic resin, epoxy resin, silicone resin, fluorine resin, or siloxane resin or the like.

The substrate 335 is provided on the inorganic insulating film 333 via an adhesive member 334. The adhesive member 334, for example, adhesive member such as an acrylic system, a rubber system, a silicone system, or a urethane system can be used. The adhesive member 334 may contain a hygroscopic material such as calcium or zeolite. The moisture-absorbing substance contained in the pressure-sensitive the adhesive member 334 may delay arrival of moisture to the light emitting element 330 even if the moisture enters the inside of the display device 200.

Usable as a substrate 335 may be a glass substrate, a quartz substrate, and a flexible substrate (flexible resin substrate formed of polyimide, polyethylene terephthalate, polyethylene naphthalate, triacetyl cellulose, cyclic olefin-copolymer, cycloolefin polymer or the like).

The adhesive member 334 may be provided with spacers to ensure a gap between the substrate 101 and the substrate 335. Such a spacer may be mixed into the adhesive member 334 or may be formed on the substrate 101 by a resin or the like.

In the display device according to an embodiment of the present invention, the effect of the fixed charge included in the protective film 116 can be reduced by providing the conductive layer 118 so as to overlap with a part of region 120. The sealing film used in the display device 200 according to an embodiment of the present invention includes the inorganic insulating film 331 and the inorganic insulating film 333. For the inorganic insulating film 331 and the inorganic insulating film 333, it is preferable to use a hydrogen-reduced silicon nitride film. However, as described in the previous embodiment, the hydrogen-reduced silicon nitride film contains a very large amount of positive fixed charge. For the silicon nitride film included in the sealing film, the effect of the fixed charge can be reduced by the conductive layer 118, which is provided to overlap with a portion of the region 120. The reliability of the display device using the transistor can be improved.

Fifth Embodiment

Figure 7:
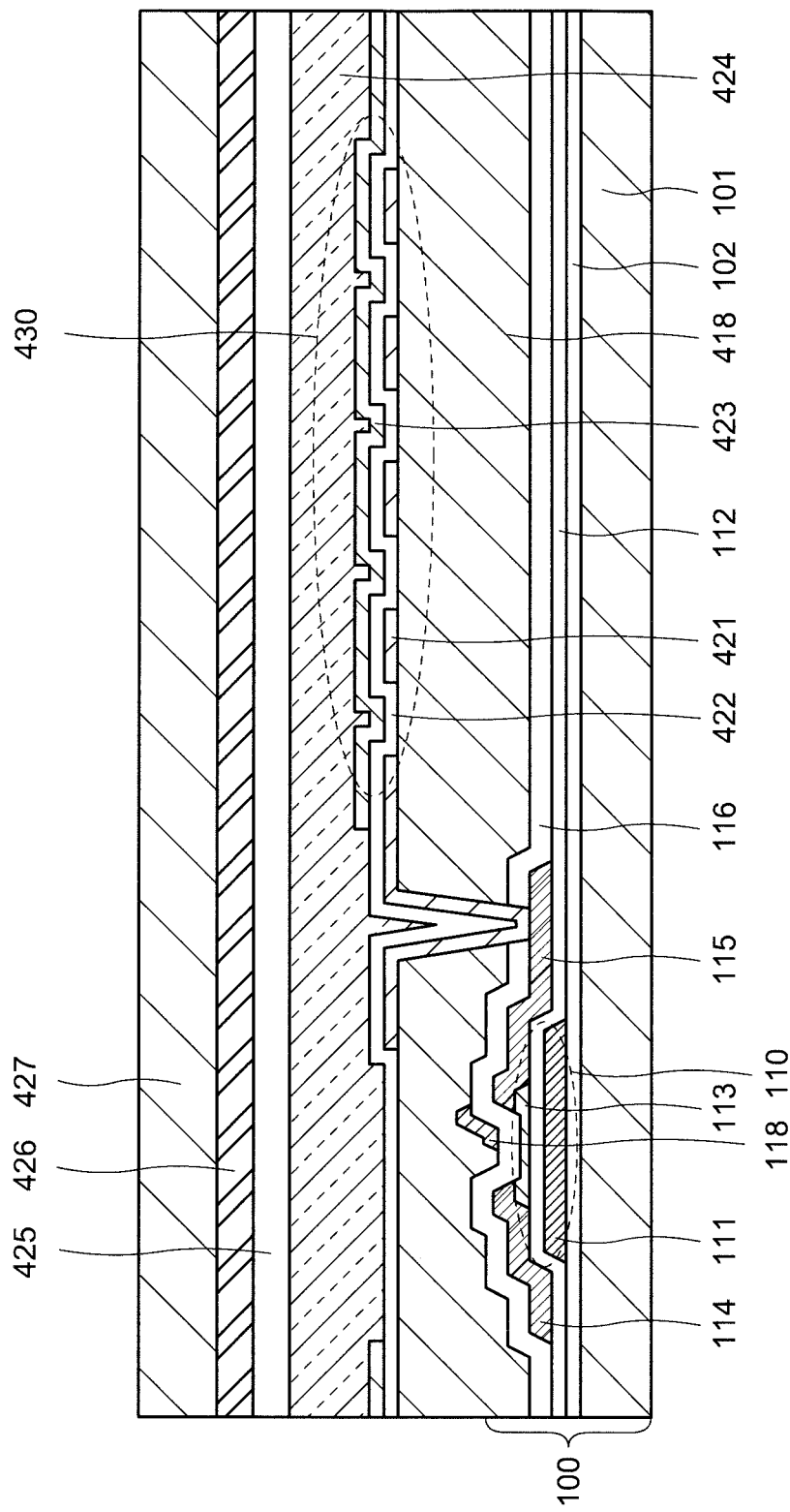
FIG. 7 is a cross-sectional view showing a pixels of a display device according to an embodiment of the present invention.

In the fifth embodiment, a display device according to an embodiment of the present invention will be described referring to FIG. 5 and FIG. 7. In this embodiment, a case where a liquid crystal element is used as the pixel 208 shown in FIG. 5 will be described. In the pixel 208, the semiconductor device 100 according to the first embodiment is used, but the semiconductor device 100A according to the second embodiment and the semiconductor device 100B according to the third embodiment may be used.

<Second Structure of the Pixel 208>

In this embodiment, the case where the display device is a liquid crystal display device will be described. FIG. 7 is a cross-sectional view of the pixel 208. The pixel 208 has at least the transistor 110 according to the first embodiment and a liquid crystal element 430 on substrate 101.

The protective film 116 is provided on the transistor 110. The conductive layer 118 is provided on the protective film 116. As described in FIG. 1A and FIG. 1B, a portion of the region 120 of the transistor 110 is overlapped the conductive layer 118. In FIG. 7, the region 120 of the transistor 110 is not shown. Regarding the detailed description of the region 120 of the transistor 110, the description regarding FIG. 1A may be referred to.

A planarization film 418 is provided on the protective film 116. The planarization film 418 may be formed of polyimide resin, polyamide resin, acrylic resin, epoxy resin or the like. The planarization film 418 of such a material may be formed by a solution application method, and have a high effect of flattening. The protective film 116 and the planarization film 418 are provided with openings.

A pixel electrode 421 is provided on the planarization film 418. The pixel electrode 421 is formed of an indium oxide-based transparent conductive layer (i.e., ITO), a zinc oxide-based transparent conductive layer (i.e., IZO, ZnO) or the like. The pixel electrode 421 is connected to the source or drain electrode 115 via an opening. The pixel electrode 421 is separated for each pixel and provided in a comb-tooth shape in plan view.

An insulating film 422 is provided on the pixel electrode 421. The insulating film 422 may be formed of a silicon oxide film or a silicon nitride film. A common electrode 423 is provided on the insulating film 422. The common electrode 423 may be formed of materials similar to those of the pixel electrode 421. The common electrode 423 is provided over each pixel and an opening is provided in an area overlapped on the transistor in plan view.

A substrate 427 is provided with a color filter 426 and a planarization film 425. A liquid crystal layer 424 is provided between the planarization film 425 and the common electrode 423. A liquid crystal device 430 includes the pixel electrode 421, the common electrode 423, and the liquid crystal layer 424.

The display device according to an embodiment of the present invention can reduce the effect of the fixed charge in the protective film 116 by providing the conductive layer 118 to overlap a portion of the region 120 of the oxide semiconductor layer 113. When a silicon nitride film is used as the insulating film 422 used in the display device of an embodiment of the present invention, it is preferable to use a hydrogen-reduced silicon nitride film. However, as described in the previous embodiment, the hydrogen-reduced silicon nitride film contains a very large amount of positive fixed charge. For the silicon nitride film contained in the insulating film 422, the effect of the fixed charge can be reduced by the conductive layer 118 provided so as to overlap a portion of the region 120 corresponding to the back channel of the transistor 110. This reduces the variability of the characteristics of transistor using oxide semiconductor. The reliability of the display device using the transistor can be improved.

EXAMPLES

In this example, the results of simulations of a semiconductor device according to an embodiment of the present invention will be described.

Figure 8A:
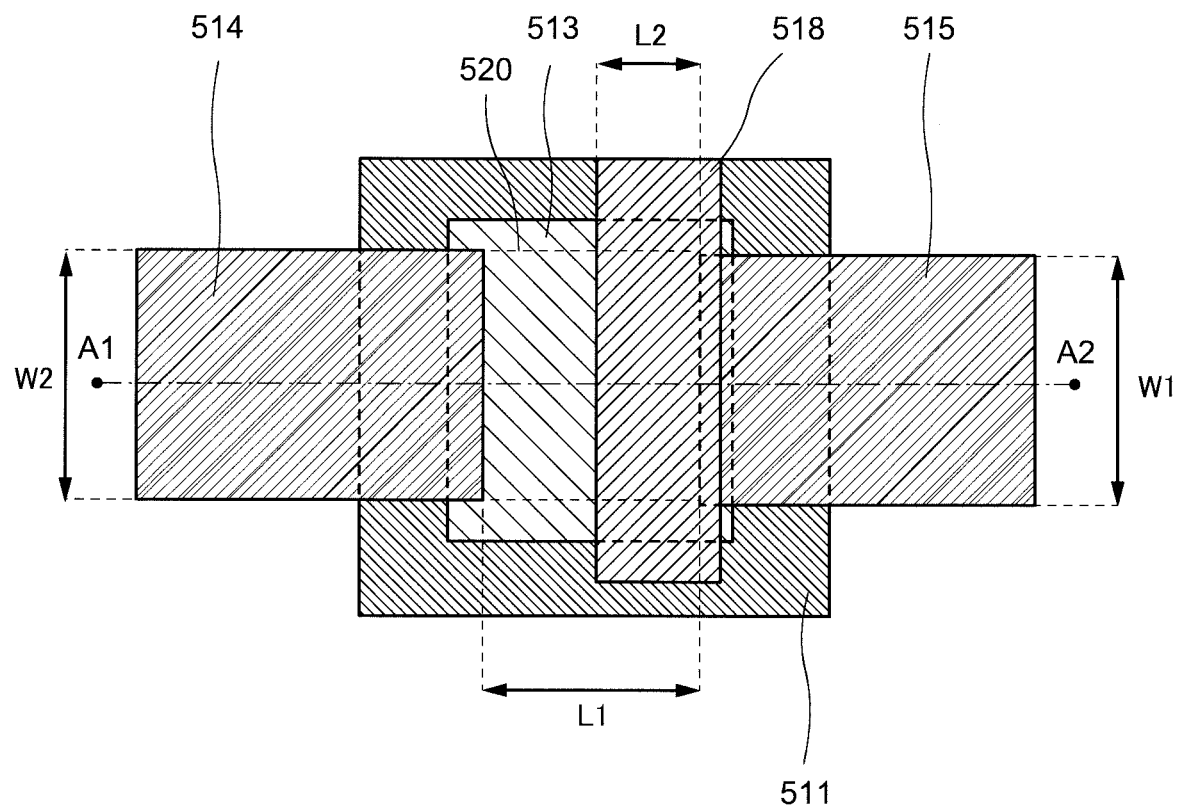
FIG. 8A is a top view showing a semiconductor device according to example 1.
Figure 8B:
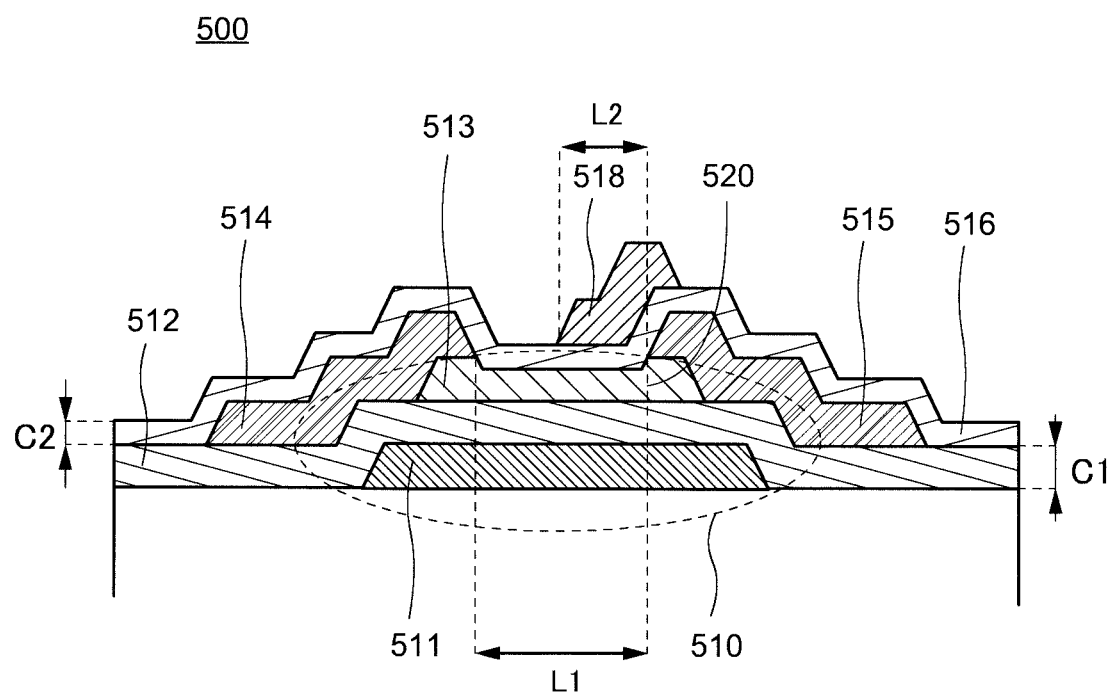
FIG. 8B is a cross-sectional view showing the semiconductor device according to example 1.

FIG. 8A and FIG. 8B are examples of models of a semiconductor device 500 used in the simulation. FIG. 8A is an example of the top view of the semiconductor device used in the simulation. FIG. 8B is the cross-sectional view taken along A1-A2 line shown in FIG. 8A.

As shown in FIG. 8B, the semiconductor device 500 includes a gate electrode 511, a gate insulating film 512 on the gate electrode 511, an oxide semiconductor layer 513 on the gate insulating film 512, which overlaps with the gate electrode 511, source or drain electrodes 514, 515 on the oxide semiconductor layer 513, and a protective film 516 on the source or drain electrodes 514, 515, and a conductive layer 518. A transistor 510 includes the gate electrode 511, the gate insulating film 512, the oxide semiconductor layers 513, the source or drain electrodes 514, 515.

As shown in FIG. 8A, the oxide semiconductor layer 513 has a region 520 located between the source or drain electrode 514 and the source or drain electrode 515. The region 520 corresponds to the region formed by the length L1 between the source or drain electrode 514 and the source or drain electrode 515 and the widths W1, W2 of the source or drain electrodes 514, 515.

In this embodiment, the ratio of the area of the conductive layer 518 to the area of the region 520 is referred to as the area ratio. The ratio of the capacity (C2) of the protective film 516 to the capacity (C1) of the gate insulating film 512 is referred to as a capacity ratio (C2/C1).

For simulations, the semiconductor devices 500A to 500F were set to area ratios of 0, 0.25, 0.5, 0.75, 0.9, and 1.0.

Table 1 shows the film thickness, the capacitance, and the capacitance ratio of the gate insulating film 512 and the protective film 516 respectively. The gate insulating film 512 has a silicon oxide film stacked on the silicon nitride film, and the protective film 516 has a silicon nitride film stacked on the silicon oxide film.

TABLE 1

|  | gate insulating film | | | protective film | | | capacity ratio (C2/C1) |
| --- | --- | --- | --- | --- | --- | --- | --- |
|  | SiNx [nm] | SiOx [nm] | C1 | SiOx [nm] | SiNx [nm] | C2 |  |
| condition 1 | 150 | 100 | 0.0223 | 300 | 100 | 0.0119 | 0.534 |
| condition 2 | 150 | 100 | 0.0224 | 200 | 100 | 0.0164 | 0.735 |
| condition 3 | 200 | 150 | 0.0157 | 300 | 100 | 0.0118 | 0.752 |
| condition 4 | 300 | 200 | 0.0112 | 300 | 100 | 0.0119 | 1.06 |
| condition 5 | 300 | 200 | 0.0111 | 200 | 100 | 0.0164 | 1.48 |

A model of the simulation was modeled by applying each of the conditions 1 to 5 to each of the semiconductor devices 500A to 500F. For the simulation model set in this way, the threshold voltage when the fixed charge Q charged on the protective film 516 was 0 [$cm^{-3}$] and the threshold voltage when the fixed charge Q charged on the protective film 516 was $5*10^{16}$ [$cm^{-3}$] have calculated.

Figure 9:
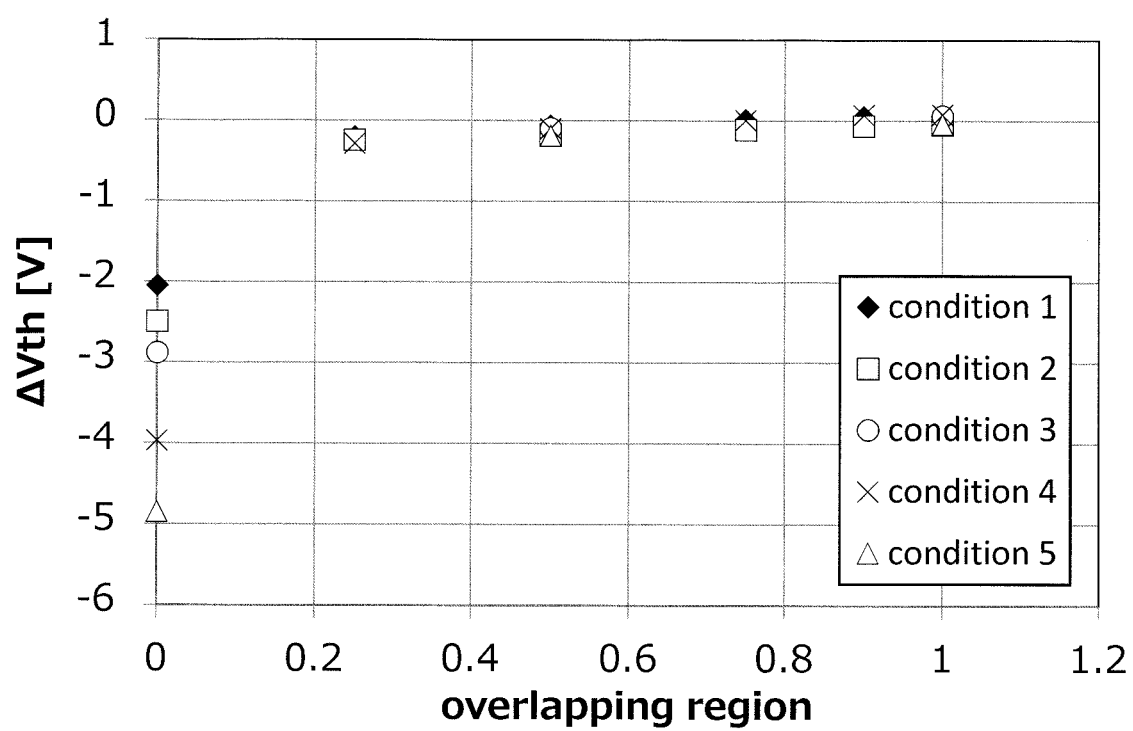
FIG. 9 is a graph showing the results of simulations.

FIG. 9 shows the results of calculating the threshold voltages for the semiconductor devices 500A to 500F, applying the conditions 1 to 5. In FIG. 9, the X-axis represents the area ratio, and the Y-axis represents the difference ($\Delta V$th) between the threshold voltages when the fixed charge Q charged in the protective film 516 is 0 [$cm^{-3}$] and the threshold voltage when the fixed charge Q is $5 \times 10^{16}$ [$cm^{-3}$].

As shown in FIG. 9, when area ratio is 0, that is, when conductive layer 518 is not superimposed on region 520, when the fixed charge Q is charged to the protective film 516 by $5 \times 10^{16}$ [$cm^{-3}$] in any of the conditions 1 to 5, the threshold voltage of the transistor is greatly affected. As shown in FIG. 9, when area ratio is at least 0.25, preferably 0.53 or more, even if the protective film 516 is charged with the fixed charge Q in any of the conditions 1 to 5, the threshold voltage of the transistor is not affected.

Next, the results shown in FIG. 9 were used to examine the extent to which the area ratio affects the threshold voltage of the transistor.

Figure 10:
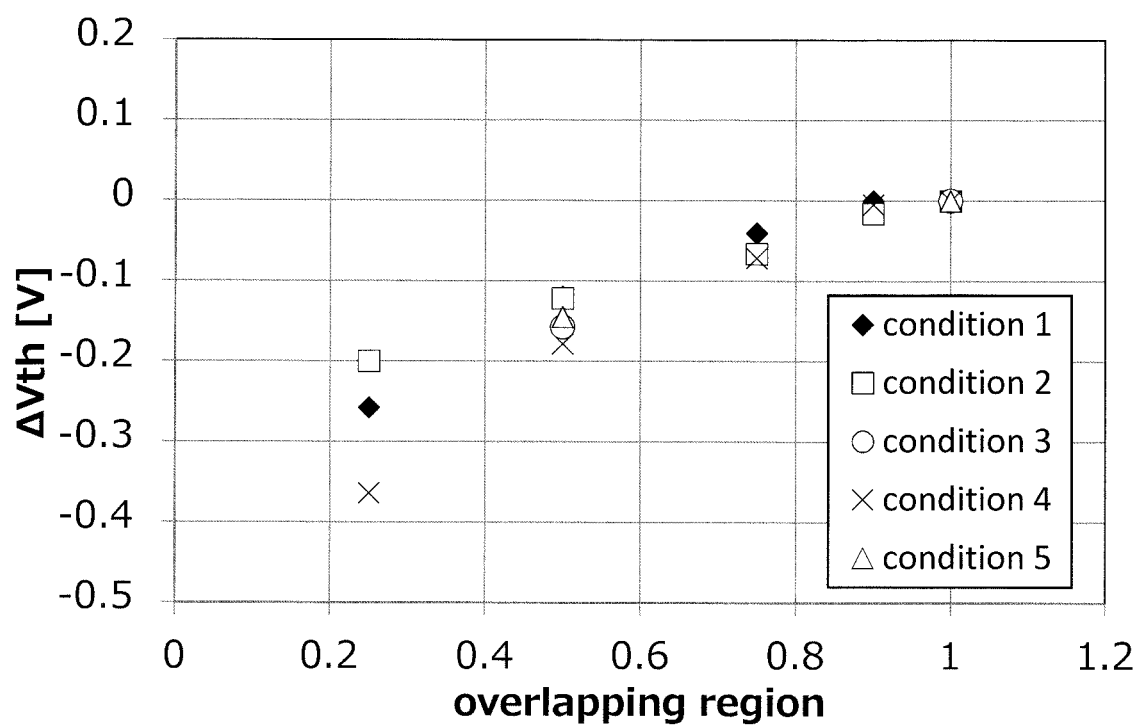
FIG. 10 is a graph showing the results of simulations.

FIG. 10 shows the results of finding the difference between the respective threshold voltages when the area ratio is 0, 0.25, 0.5, 0.75, and 0.9 and the threshold voltage when area ratio is 1. In FIG. 10, the X-axis is the area ratio, the Y-axis is the difference ($\Delta V$th) between the threshold voltage at 0, 0.25, 0.5, 0.75, 0.9, respectively, and the threshold voltage at the area ratio of 1.

As shown in FIG. 10, comparing the threshold voltage at an area ratio of 1 with the threshold voltage at an area ratio of 0.25, in the case of condition 4, it can be shown that the threshold voltage fluctuates by −0.36 V. Comparing the threshold voltage when the area ratio is 1 and the threshold voltage when area ratio is 0.53, it can be shown that the threshold voltage fluctuates by less than −0.2V in any of the conditions 1 to 5.

According to the results in FIG. 9 and FIG. 10, when the area ratio is larger than 0.25, preferably 0.53 or more, and the volume ratio is in the range of 0.53 to 1.48, it was shown that the fluctuation of the threshold voltage of the semiconductor device can be suppressed.

What is claimed is:

1. A semiconductor device comprising:
a gate electrode on a substrate;
a gate insulating film on the gate electrode;
an oxide semiconductor film via the gate insulating film on the gate electrode;
a source electrode and a drain electrode on the oxide semiconductor film;
a protective film provided on the source electrode and the drain electrode; and
a conductive layer provided on the protective film and overlapped on the oxide semiconductor layer,
wherein
the protective film includes a first silicon oxide film and a first silicon nitride film,
the first oxide film is in contact with the oxide semiconductor layer,
the gate insulating film includes a second silicon nitride film and a second silicon oxide film,
the second silicon oxide film is in contact with the oxide semiconductor layer,
the oxide semiconductor layer has a first region located between the source electrode and the drain electrode in a plan view,
the conductive layer overlaps one of the source electrode and the drain electrode, and does not overlap the other of the source electrode and the drain electrode,
the first region includes an overlapping region with the conductive layer and a non-overlapping region with the conductive layer, in a plan view,
a thickness of the protect film is thinner than a thickness of the gate insulating film, and
a ratio (C2/C1) of a capacitance C2 of the protective film to a capacitance C1 of the gate insulating film is 0.5 or more and 1.5 or less.

2. The semiconductor device according to claim 1, wherein an area of the conductive layer overlaps 0.4 or more with respect to an area of the first region.

* * * * *